(12) United States Patent
Bae

(10) Patent No.: US 7,632,108 B2
(45) Date of Patent: Dec. 15, 2009

(54) PORTABLE TERMINAL

(75) Inventor: Kuk-Hyeong Bae, Gyeonggi-Do (KR)

(73) Assignee: LG Electronics Inc., Seoul (KR)

( * ) Notice: Subject to any disclaimer, the term of this patent is extended or adjusted under 35 U.S.C. 154(b) by 83 days.

(21) Appl. No.: 11/965,654

(22) Filed: Dec. 27, 2007

(65) Prior Publication Data

US 2009/0081893 A1   Mar. 26, 2009

(30) Foreign Application Priority Data

Jan. 15, 2007   (KR)   ...................... 10-2007-0004549

(51) Int. Cl.
*H01R 12/00* (2006.01)
(52) U.S. Cl. ...................................... 439/74
(58) Field of Classification Search ................... 439/63, 439/74, 66, 700, 83, 295; 324/755, 158.1
See application file for complete search history.

(56) References Cited

U.S. PATENT DOCUMENTS 4,662,691 A * 5/1987 Derdzinski ................... 439/74

| | | | |
|---|---|---|---|
| 6,776,668 B1 * | 8/2004 | Scyoc et al. | ................. 439/700 |
| 7,365,552 B2 * | 4/2008 | Sheeran | ...................... 324/755 |
| 2006/0024985 A1 * | 2/2006 | Nagata et al. | ................. 439/63 |

FOREIGN PATENT DOCUMENTS

| KR | 20-0345687 Y1 | 3/2004 |
|---|---|---|
| KR | 10-2005-0022115 A | 3/2005 |

* cited by examiner

*Primary Examiner*—Edwin A Leon
(74) *Attorney, Agent, or Firm*—Birch, Stewart, Kolasch & Birch, LLP

(57) ABSTRACT

A mobile device including a first circuitry supporting substrate having an upper surface and a lower surface, a second circuitry supporting substrate having an upper surface and a lower surface, the second circuitry supporting substrate at least partially overlapping the first circuitry supporting substrate, and a metallic member extending from one of the lower surface of the first circuitry supporting substrate and the upper surface of the second circuitry supporting substrate, the metallic member contacting the other of the lower surface of the first circuitry supporting substrate and the upper surface of the second circuitry supporting substrate to define a shield region between the first circuitry supporting substrate and the second circuitry supporting substrate.

11 Claims, 4 Drawing Sheets

PORTABLE TERMINAL

CROSS-REFERENCE TO RELATED APPLICATIONS

This application claims priority to Korean Patent Application No. 10-2007-0004549, filed Jan. 15, 2007, which is herein incorporated by reference.

BACKGROUND OF THE INVENTION

1. Field of the Invention

The present disclosure relates generally to a mobile device, and more particularly, to a mobile device having at least one member extending between two circuitry supporting substrates to define a shield region.

2. Description of Related Art

A related art mobile device in the form of a portable terminal provides multiple functionality including receiving/transmitting voice signals, accessing the Internet, and downloading data files such as music and video. However, for the portable terminal to perform these various functions, many different electronic components are provided therein. Consequently, when the portable terminal is operated, electromagnetic interference (EMI) is generated from the electronic components, which may adversely affect the functionality of other electronic components. For example, the EMI generated from one component may cause signal distortion on other components. Accordingly, research for shielding electronic components that generate an electromagnetic wave or electronic components influenced by an electromagnetic wave is ongoing.

As the portable terminal becomes increasingly smaller, the number of circuitry supporting substrates, such as printed circuit boards (PCBs) mounted in the portable terminal increases in an attempt to fully utilize the internal space of the portable terminal. With the increasing number of PCBs and electronic components located more densely in the portable terminal, it is becoming increasing difficult to provide adequate electromagnetic shielding within the portable terminal.

BRIEF SUMMARY OF THE INVENTION

Therefore, an object of the present invention is to provide a portable terminal, which includes two or more PCBs therein, capable of shielding desired electronic components without the shielding unit(s) interfering with each other or the electronic components on the PCBs.

Another object of the present invention is to provide a mobile device capable of allowing a manufacture to have a free circuit design by mounting electronic components at the desired positions without limitations in space and position due to mounting of the shielding unit(s).

Still another object of the present invention is to provide a mobile device capable of being thinner that related art mobile devices by reducing a gap between PCBs.

To achieve these and other advantages and in accordance with the purpose of the present invention, as embodied and broadly described herein, there is provided a mobile device including a first circuitry supporting substrate having an upper surface and a lower surface, a second circuitry supporting substrate having an upper surface and a lower surface, the second circuitry supporting substrate at least partially overlapping the first circuitry supporting substrate, and a metallic member extending from one of the lower surface of the first circuitry supporting substrate and the upper surface of the second circuitry supporting substrate, the metallic member contacting the other of the lower surface of the first circuitry supporting substrate and the upper surface of the second circuitry supporting substrate to define a shield region between the first circuitry supporting substrate and the second circuitry supporting substrate.

According to principles of the present invention, there is also provided a mobile device including a first circuitry supporting substrate having an upper surface and a lower surface, a second circuitry supporting substrate having an upper surface and a lower surface, the second circuitry supporting substrate at least partially overlapping the first circuitry supporting substrate, a first metallic member located on the lower surface of the first circuitry supporting substrate, the first metallic member extending towards the upper surface of the second circuitry supporting substrate, a second metallic member located on the upper surface of the second circuitry supporting substrate, the second metallic member extending towards the lower surface of the first circuitry supporting substrate. The first metallic member and the second metallic member contact each other to define a shield region between the first circuitry supporting substrate and the second circuitry supporting substrate.

The foregoing and other objects, features, aspects and advantages of the present disclosure will become more apparent from the following detailed description of the present disclosure when taken in conjunction with the accompanying drawings. Further scope of applicability of the present application will become more apparent from the detailed description given hereinafter. However, it should be understood that the detailed description and specific examples, while indicating preferred embodiments of the invention, are given by way of illustration only, because various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE INVENTION

Reference will now be made in detail to the preferred embodiments of the present disclosure, examples of which are illustrated in the accompanying drawings. Hereinafter, a mobile device in the form of a bar-type portable terminal will be explained. However, the present invention is not limited to the bar-type portable terminal, but may also be applied to various portable terminals, such as a folder type, a slide type, and a swivel type portable terminal.

Figure 1A:
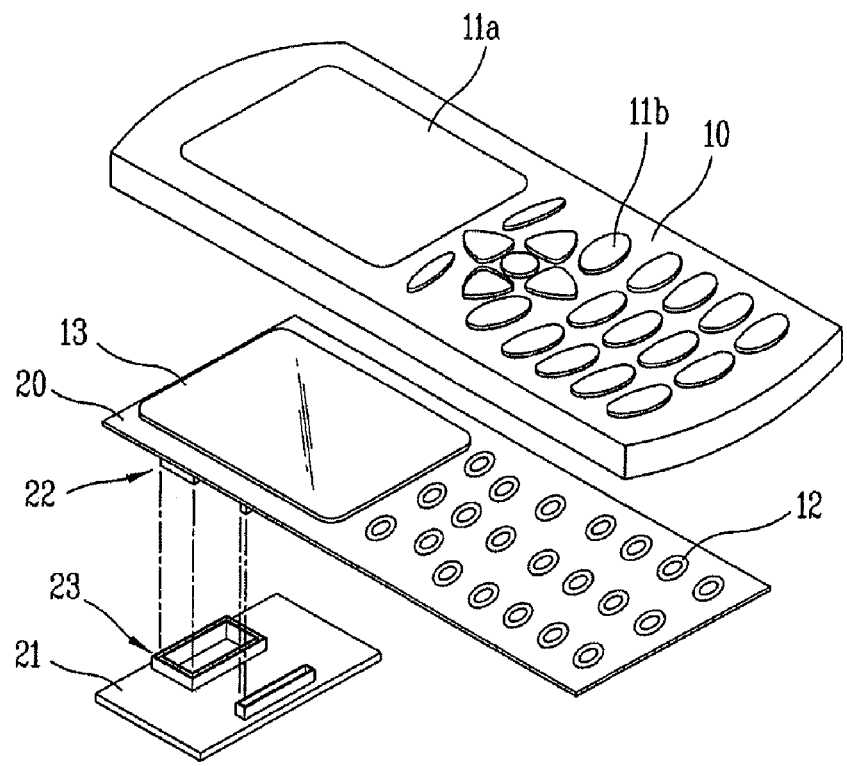
FIG. 1A is an exploded perspective view showing a portable terminal according to a first embodiment of the present invention.
Figure 1B:
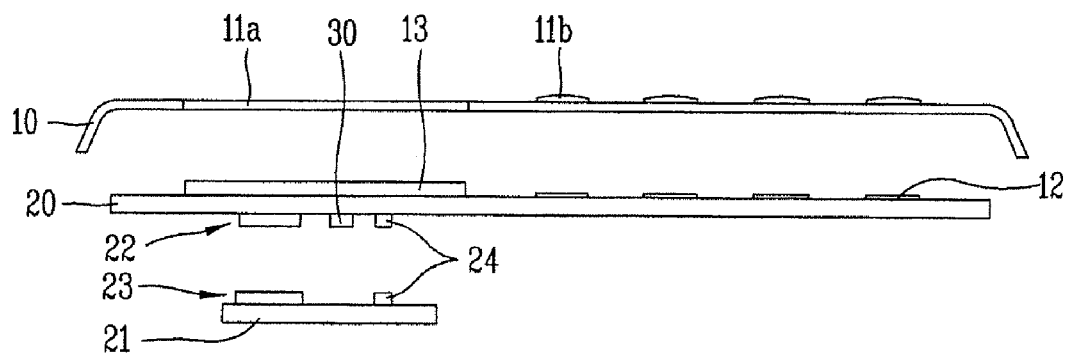
FIG. 1B is a sectional view of the portable terminal of FIG. 1A.

As shown in FIGS. 1A and 1B, a portable terminal according to the present invention includes at least one body 10 (only one shown for clarity), at least two circuitry supporting substrates in the form of first and second PCBs 20 and 21, and first and second shielding units 22 and 23 located on the first and second PCBs 20 and 21, respectively. Shielding unit 22 is a metallic member that extends from a lower surface of the first PCB 20 towards the second PCB 21 and shielding unit 23 is a metallic member that extends from an upper surface of the second PCB 21 towards the first PCB 20. Depending on the specific arrangement of the shielding units 22 and 23, the free ends of the shielding units 22 and 23 not connected to the PCBs 20 and 21, respectively, may contact the opposing surface PCBs 21 and 20, respectively. Alternatively, the free ends of the shielding units 22 and 23 may cooperate with each other to define a shielded region. For example, as shown in FIGS. 1 to 3, the arrangement of the shielding units 22 and 23 and the PCBs 20 and 21 define a shield region between the first PCB 20 and the second PCB 21 in which one or more electronic components 30 are located.

The body 10, which may be a cover of the portable terminal) includes a transparent window 11a for viewing contents displayed on a display unit 13, and an input unit 11b, such as a key pad, for inputting numbers, characters, symbols, and the like. As described above at least two PCBs 20 and 21 are mounted in the body 10. In this exemplary embodiment, the PCB 20 disposed closest the body 10 may include the display unit 13 for displaying various information inputted through the input device 11b and one or more switches 12 to detect the inputting of information via the input device 11b.

Various electronic components 30 may be mounted on the PCBs 20 and 21, some of which may be isolated from other electronic components by being placed in the shield region between the first and second shield members 22 and 23. As described above, during operation of the portable terminal, the electronic components 30 may generate EMI that adversely affect one or more other electronic components, such as signal distortion or other adverse affect. Accordingly, the first and second shielding units 22 and 23 are configured to shield the electronic components within the shield region from the electronic components arranged outside the shield region.

Figure 2:
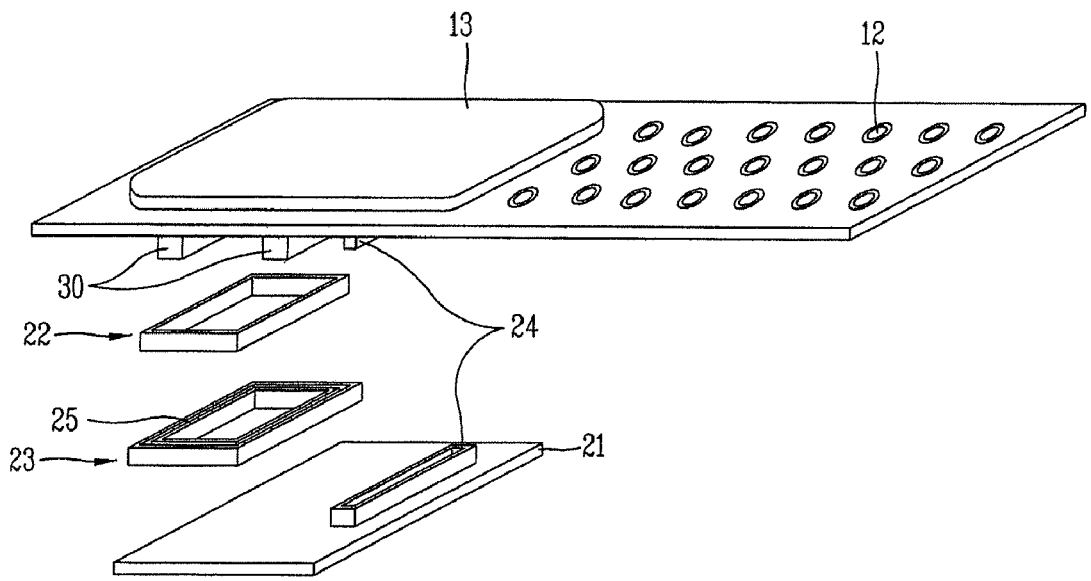
FIG. 2 is an exploded perspective view showing a coupling method between first and second shielding units according to a first embodiment of the present invention.
Figure 3:
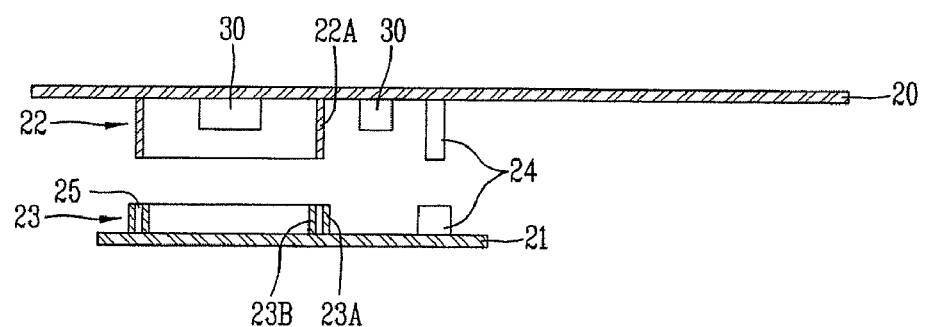
FIG. 3 is a sectional view of coupling method between the first and second shielding units of FIG. 2.
Figure 4:
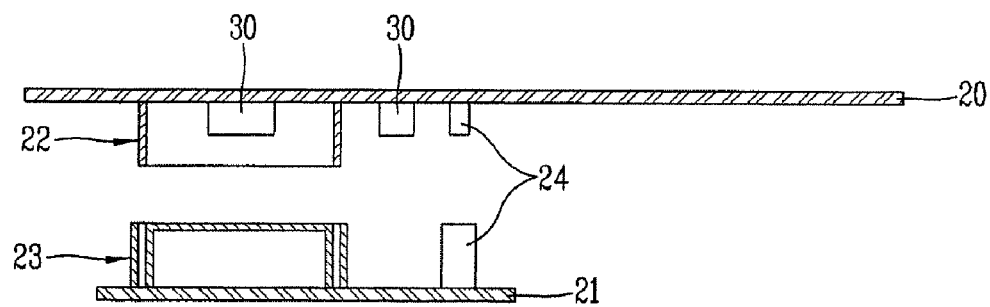
FIG. 4 is a sectional view showing a coupling method between the first and second shielding units according to a second embodiment of the present invention.

As shown in FIGS. 1-3, the first shielding unit 22 is located at the first PCB 20, and the second shielding unit 23 is located at the second PCB 21. The shielding units 22 and 23 may be formed of sheet metal or other materials imbedded with metal. When the first and second shielding units 22 and 23 are coupled or at least partially overlap each other, the first and second shielding units define the shield region such that EMI generated inside the shield region does not impact the electronic components located outside the first and second shielding units 22 and 23 and EMI generated by the electronic components 30 located outside the first and second shielding units 22 and 23 does not impact the electronic components located inside the shield region.

As shown in FIG. 2, the first shielding unit 22 includes a single wall body 22A and the second shielding unit 23 includes an outer wall body 23A and an inner wall body 23B. The outer wall body 23B is spaced from the inner wall body 23B to define a fitting groove 25. The first and second shielding units 22 and 23 are coupled to each other as the first shielding unit 22 is fitted into the fitting groove 25 of the second shielding unit 23. The arrangement of the first and second shielding units 22 and 23 could be reversed. In addition, one of the inner and outer wall bodies 23 could be eliminated so long as contact is maintained between the first and second shielding units.

As shown in FIGS. 2 and 3, the height of the first and second shielding units 22 and 23 can be different (FIG. 2) or equal (FIG. 3) depending on the coupling intensity or the amount of shielding to be provided. For example, when a high coupling intensity or a high shielding degree is required, the contact surfaces between the first and second shielding units 22 and 23 will have substantially the same height.

Figure 5:
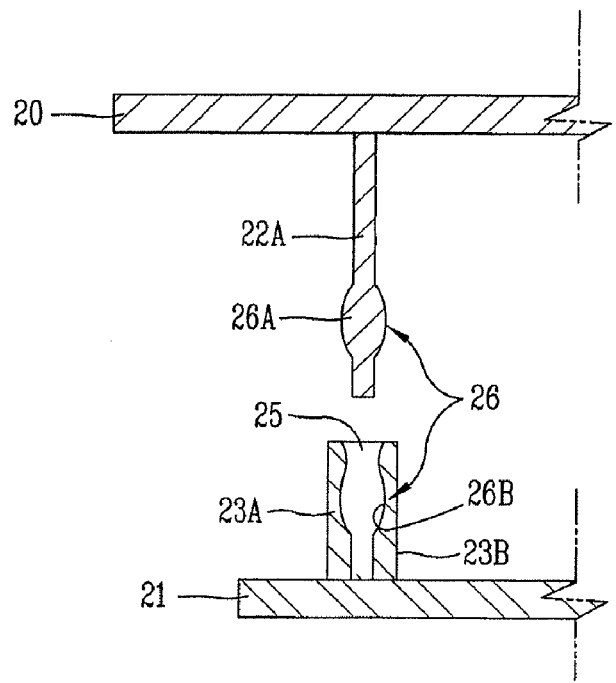
FIG. 5 is a partial sectional view showing a coupling method between the first and second shielding units according to a third embodiment of the present invention.

While the contact surfaces of the first and second shielding units 22 and 23 are shown as being substantially planar, various modifications for reinforcing the coupling intensity may be implemented. For example, as shown in FIG. 5, a protrusion 26A and a recessed portion 26B may be formed at contact surfaces between the first and second shielding units 22 and 23, respectively, to reinforce the coupling between the first and second shielding units. As shown in FIG. 5, the contact surfaces may be formed at opposing ends of each of the first and second shielding units 22 and 23. Various shapes for the protrusions and recessed portions may be provides, such as, a spherical shape, a rectangular parallelepiped shape, and a conical shape, among others. In addition, the location of the protrusion and recessed portion can be altered so that protrusions are formed in the fitting groove 25 and recessed portions are provided on the first shielding member 22.

Figure 6:
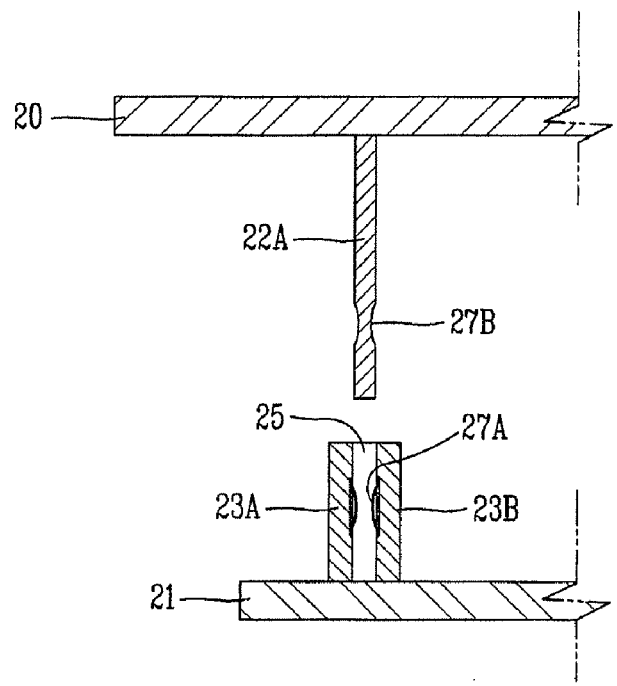
FIG. 6 is a partial sectional view showing a coupling method between the first and second shielding units according to a fourth embodiment of the present invention.

Another modification to the contact surfaces of the first and second shielding units, as seen in FIG. 6, includes an elastic member 27A provided at one of the first and second shielding units 22 and 23, thereby reinforcing a coupling intensity between the first and second shielding units 22 and 23. The elastic member 27A may take the form of a connection member between a spring and a metallic ball, a rubber projection, among other elastic members. A groove 27B is formed at a side surface of the first shielding unit 22 that contacts the elastic member 27A, thereby reinforcing the coupling between the first and second shielding units 22 and 23. Similar to the projection and recessed portion described above, the placement of the elastic member 27A and the groove 27B may be replaced.

Figure 7:
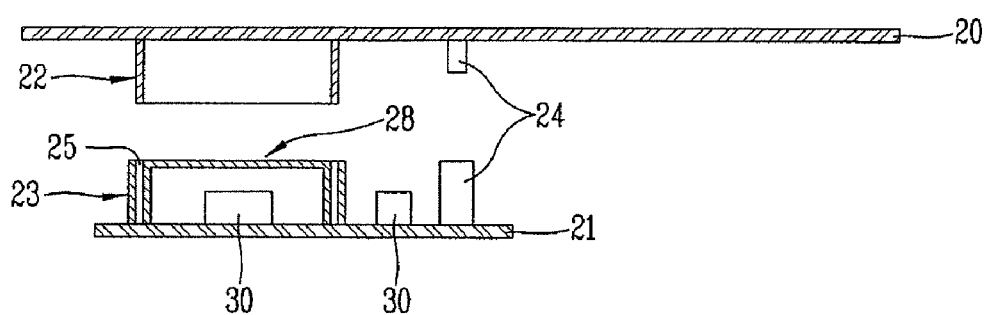
FIG. 7 is a partial sectional view showing a shielding unit having a shielding surface according to a fifth embodiment of the present invention.

While the above exemplary embodiments provided a shield region that prevented EMI from electronic components outside of the shield region from interfering with electronic components located inside the shield region, it may be desirable to shield one or more electronic components in the shield region from each other. This may occur where for design limits, one or more electronic components are required to occupy the same region. One approach to solving this problem includes providing a metallic member that can further divide the shield region, as shown in FIG. 7. As shown in this exemplary embodiment, the inner wall 23B may be replaced with a third shielding unit 28 that has a planar surface to enclose the electronic component 30 between the PCB 21 and the third shielding unit. The height of the third shielding unit can be selected so as not to physically interfere with the electronic components 30 on both the first and second PCBs.

In addition to the shielding units 22 and 23, two connectors 24 are configured to be coupled to each other in a fitting manner are provided on opposing surfaces of the first and second PCBs 20 and 21 to provide a connection circuit between the first and second PCBs 20 and 21. Not only do the connectors 24 electrically connect the circuits provided at the PCBs 20 and 21, they also further support a coupled state between the first and second PCBs 20 and 21. The first and second shielding units 22 and 23, in addition to shielding the electronic components, also serve as a connector for the first and second PCBs 20 and 21.

The portable terminal according to the present invention has several advantages. First, a portable terminal, which includes two or more PCBs therein, may be capable of shielding desired electronic components without the shielding unit (s) interfering with each other or the electronic components on the PCBs. Second, the shielding unit(s) may allow a manufacture to have a free circuit design by mounting electronic components at the desired positions without limitations in space and position due to mounting of a the shielding unit(s). Third, an overall thickness of the portable terminal may be reduced by decreasing a gap between the PCBs. Fourth, the many permutations of the shielding unit(s) allow for greater flexibility in coupling intensity and shielding strength. Fifth, the shielding unit(s) may also function to provide a connection mechanism between the two PCBs.

The foregoing embodiments and advantages are merely exemplary and are not to be construed as limiting the present invention. The present invention can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

What is claimed is:

1. A portable terminal comprising:
   a first circuitry substrate having an upper surface and a lower surface;
   a second circuitry substrate having an upper surface and a lower surface and at least partially overlapping with the first circuitry substrate;
   a first electromagnetic interference shielding member disposed at the lower surface of the first circuitry substrate to extend toward the upper surface of the second circuitry substrate; and
   a second electromagnetic interference shielding member disposed at the upper surface of the second circuitry substrate to extend toward the lower surface of the first circuitry substrate, and coupled to the first electromagnetic interference shielding member to define a shielding region between the first and second circuitry substrates.

2. The portable terminal of claim 1, wherein the first and second electromagnetic interference shielding members have the same height.

3. The portable terminal of claim 1, wherein a display for displaying visual information is disposed at the upper surface of the first circuitry substrate.

4. The portable terminal of claim 1, further comprising connectors configured to connect the first and second circuitry substrates to each other,
   wherein the connectors comprise:
   a first connector disposed at the lower surface of the first circuitry substrate; and
   a second connector disposed at the upper surface of the second circuitry substrate and coupled to the first connector.

5. The portable terminal of claim 1, further comprising a shielding surface disposed at one of the first and second electromagnetic interference shielding members and configured to partition a region between the first and second circuitry substrates.

6. The portable terminal of claim 1, where the first electromagnetic interference shielding member is directly connected to the lower surface of the first circuitry substrate and the second electromagnetic interference shielding member is directly connected to the upper surface of the second circuitry substrate.

7. The portable terminal of claim 1, wherein the second electromagnetic interference shielding member comprises a first side wall and a second side wall spaced apart from the first side wall to form a groove, the first electromagnetic interference shielding member being inserted into the groove.

8. The portable terminal of claim 7, wherein an insertion protrusion is formed at one of the first electromagnetic interference shielding member and the groove, and an insertion hole having the insertion protrusion inserted therein is formed in another one of the first electromagnetic interference shielding member and the groove.

9. The portable terminal of claim 7, wherein an elastic member is further provided at one of the first electromagnetic interference shielding member and the groove so as to contact another one of the first electromagnetic interference shielding member and the groove.

10. The portable terminal of claim 1, further comprising at least one electronic component located inside the shielding region and connected to at least one of the first and second circuitry substrates.

11. The portable terminal of claim 10, further comprising at least one electronic component located outside the shielding region and connected to at least one of the first and second circuitry substrates.

* * * * *